(12) United States Patent
Sturcken et al.

(10) Patent No.: US 7,491,577 B2
(45) Date of Patent: Feb. 17, 2009

(54) METHOD AND APPARATUS FOR PROVIDING THERMAL MANAGEMENT ON HIGH-POWER INTEGRATED CIRCUIT DEVICES

(75) Inventors: Keith K. Sturcken, Manassas, VA (US); Thomas J. McIntyre, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 108 days.

(21) Appl. No.: 11/620,867

(22) Filed: Jan. 8, 2007

(65) Prior Publication Data

US 2008/0164603 A1 Jul. 10, 2008

(51) Int. Cl.
*H01L 21/00* (2006.01)
(52) U.S. Cl. .............. 438/106; 257/E21.001; 257/E23.08; 257/706; 257/713
(58) Field of Classification Search .......... 438/106; 257/E21.001, 706, 713, E23.08
See application file for complete search history.

(56) References Cited

U.S. PATENT DOCUMENTS

| | | | |
|---|---|---|---|
| 6,545,903 B1 * | 4/2003 | Wu | 365/148 |
| 7,295,463 B2 * | 11/2007 | Yang et al. | 365/163 |
| 7,306,028 B2 * | 12/2007 | Zuo et al. | 165/104.26 |
| 2002/0033247 A1 * | 3/2002 | Neuschutz et al. | 165/10 |
| 2005/0214523 A1 * | 9/2005 | Jayaraman et al. | 428/323 |
| 2006/0030108 A1 * | 2/2006 | Cho et al. | 438/281 |
| 2006/0060952 A1 * | 3/2006 | Yuan et al. | 257/675 |
| 2007/0062676 A1 * | 3/2007 | Yao | 165/104.33 |
| 2007/0068173 A1 * | 3/2007 | Sauciuc et al. | 62/3.3 |
| 2007/0290310 A1 * | 12/2007 | Kusano et al. | 257/684 |
| 2008/0042118 A1 * | 2/2008 | Hayakawa | 257/4 |

* cited by examiner

*Primary Examiner*—Alexander G Ghyka
*Assistant Examiner*—Angel Roman
(74) *Attorney, Agent, or Firm*—Daniel J. Long; Antony P. Ng; Dillon & Yudell LLP

(57) ABSTRACT

An apparatus for providing thermal management on high-power integrated circuit devices is disclosed. Initially, contacts to active devices are formed. Phase change materials are then applied over potential hot spots that can be formed by the active devices. A layer of high-thermally conductive materials is deposited over the phase change materials. The layer of high-thermally conductive materials and the phase change materials are subsequently etched according to a pattern. A layer of passivation conductive vias is subsequently applied to the phase change materials to complete the formation of phase change heatsinks.

14 Claims, 3 Drawing Sheets

METHOD AND APPARATUS FOR PROVIDING THERMAL MANAGEMENT ON HIGH-POWER INTEGRATED CIRCUIT DEVICES

BACKGROUND OF THE INVENTION

1. Technical Field

The present invention relates to thermal management in general, and in particular to thermal management on electronic devices. Still more particularly, the present invention relates to a method and apparatus for providing thermal management on high-power integrated circuit devices.

2. Description of Related Art

Integrated circuit devices generally dissipate more heat as their performances increase, which can increase the operating temperature of the integrated circuit devices. Such a problem is becoming more acute as the size of silicon chips become larger yet the sizes of the electronic components within the silicon chips approach nanometer scale.

The prior art methods of integrated circuit cooling typically employ conduction and convection cooling at a device level by attaching a heatsink to one of the surfaces of an integrated circuit device, and ambient air is forced over the heatsink to carry heat away from the heatsink. The prior art methods of integrated circuit cooling were effective when chip powers were uniformly distributed with a total of less than one watt, but are no longer effective as chip powers exceed five watts and are generally focused in very small areas at a circuit level.

To effectively cool small regions of an integrated circuit device at a circuit level under the above-mentioned power conditions using traditional methods of integrated circuit cooling would require such an over-design in the rest of the silicon chip that it becomes too impractical to implement. Consequently, it would be desirable to provide an improved method and apparatus for providing thermal management on high-power integrated circuit devices.

SUMMARY OF THE INVENTION

In accordance with a preferred embodiment of the present invention, a layer of phase change materials is applied over a potential hot spot that can be formed by an active component within an integrated circuit device. A layer of high thermal conductivity materials is then deposited over the layer of phase change materials. A heat conducting via is provided to direct heat away from the layer of high thermal conductivity materials.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
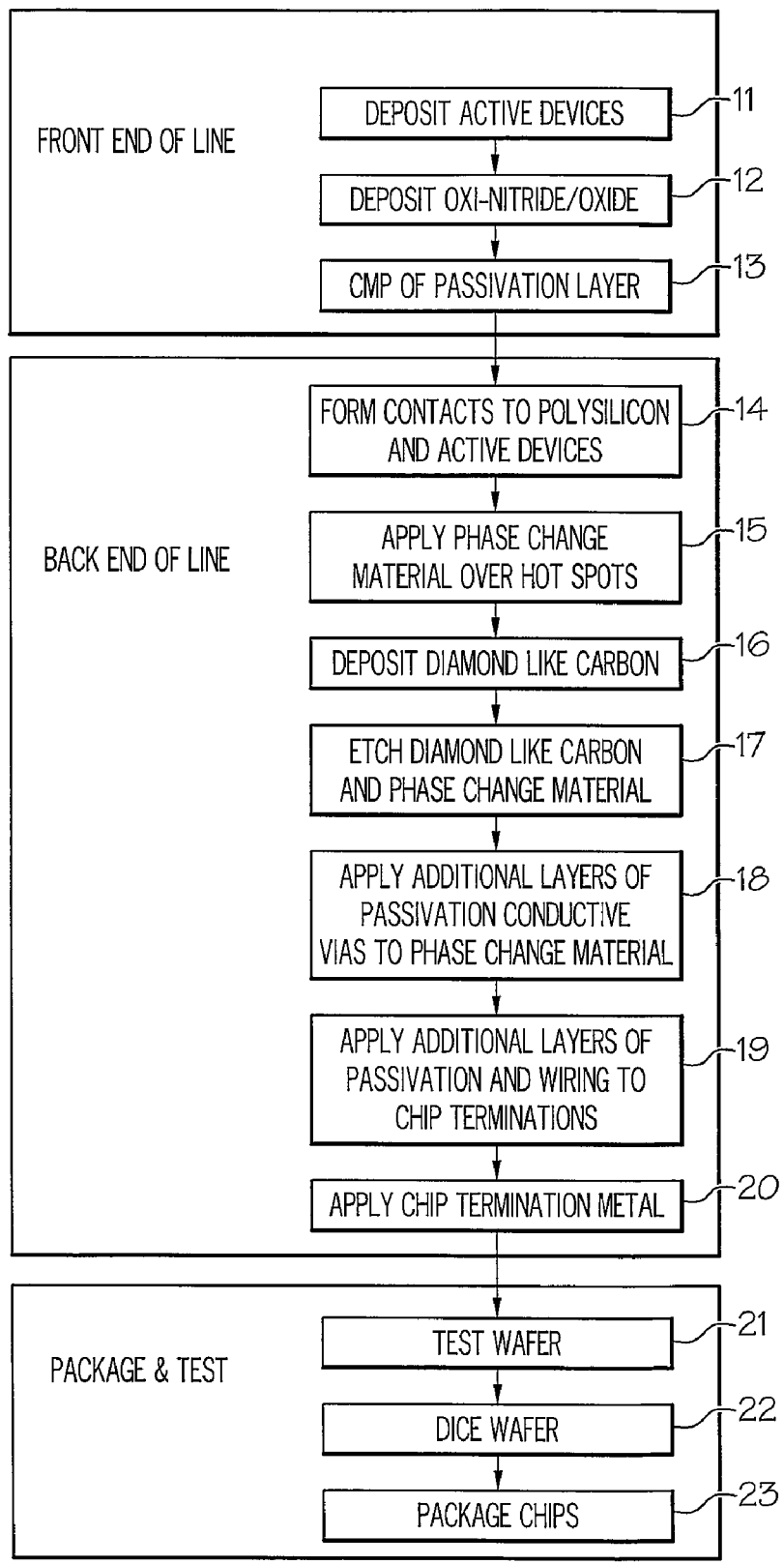
FIG. 1 is a high-level logic flow diagram of a method for manufacturing phase change heatsinks.

During the normal operation of an integrated circuit device, there are localized, thermal transients occurring across the active surface of the silicon chip. These hot spots are caused by high-power function circuits found at specific locations on the chip. Such situation becomes more acute as the chip operates faster with smaller features. It is often found that high-power function circuits are dissipating large amount of power by cycling on and off at a very high rate of speed. For some high-power function circuits, a series of gates switch on at the beginning of a duty cycle, drawing a sudden current spike and then not drawing any significant power for the remainder of the duty cycle. A typical duty cycle for many high-power function circuits is approximately 30 ns, and a 4 ns surge can occur within the first 7 ns of the cycle. It is during such sudden current surge that most of the power for the high-power function circuit is dissipated.

A thermal management scheme that can absorb the power generated during a short transient and then dissipate the power through the remainder of the duty cycle and be ready to absorb power during the next transient is likely to be highly effective in maintaining a safe operating temperature for an integrated circuit device. The placement of a phase change material near a high-power function circuit that has a melting temperature close to the operating temperature of the integrated circuit device can absorb large amounts of heat without additional temperature increase. This is due to the fact that the phase change material generally requires a significant amount of heat energy to change phase (e.g., from solid to liquid), and that during the phase change, the temperature of the phase change material remains the same.

The placement of a phase change material on top of a high-power function circuit experiencing significant power surges allows an absorption of the heat generated during the surge without an increase in temperature. In addition, the attachment of a thermal conduit having a high thermal conductivity on top of the phase change material allows permanent removal of the heat from the high-power function circuit. The removal of heat through such thermal conduit allows the phase change material to re-solidify and ready to absorb power during the next localized power surge.

The ability of a conventional single phase heatsink to absorb heat during a thermal transient is normally determined by the thermal conductivity, density and specific heat of the material and volume of the heatsink. Even in the solid phase, the amount of heat that can be absorbed by a body is calculated in terms of enthalpy by using the following equation:

$$h = \rho(C_p)(T_1 - T_2) \quad (1)$$

where $h$=enthalpy, $\rho$=density, $C_p$=specific heat, and $T$=temperature.

As equation (1) indicates, as soon as the single phase heatsink begins to absorb heat, the temperatures of the heatsink and the adjoining material begin to rise. This is normally acceptable in a conventional heatsink design providing the rise in temperature is kept below the maximum allowable operating temperature for an integrated circuit device. Such requirement drives the size and overall effectiveness of the heatsink.

When using a phase change material for thermal management, a significant amount of energy, again expressed in enthalpy, is required for the phase change material to change phase. During the phase change, there is no change in temperature as describe in the equation below:

$$h = \rho(C_{ps}/I) \quad (2)$$

where h=enthalpy, $C_{ps}/I$=specific heat due to phase change.

The phase change enthalpy of a phase change material, which can be determined experimentally, is usually five to ten times greater than the enthalpy absorbed by a single phase heatsink of the typical operating temperature range of an integrated circuit device.

A phase change material capable of performing the functions described above needs to have the following characteristics:

1. low-phase change temperature;
2. ability to change phases from solid to liquid and back to solid rapidly; and
3. compatible with silicon device designs and fabrication processes.

An example of such a phase change material is bismuth/indium alloy (i.e., chalcogenide). The electric material composition of bismuth/indium alloy melts at 78.5° C., which is well below the maximum allowable operating temperatures of 85° C. and 105° C. for integrated circuit devices in commercial and aerospace usages, respectively. The phase change enthalpy for bismuth/indium alloy is over 10,000 BTU per cubit foot. In addition, the low melting temperature of the independent elements make the bismuth/indium alloy conducive to processing in a silicon foundry.

The implementation of bismuth/indium alloy as a heatsink requires its processing to be compatible with the processes and materials used in the integrated circuit fabrication operations. Most integrated circuit fabrication operations, whether it is using silicon or other technology, can be divided into two basic areas of processing. The first area is the Front End of the Line (FEOL) where active components are placed, and the second area is the Back End of the Line (BEOL) where interconnections are place to connect the active devices in the FEOL.

The feature sizes in BEOL must be commensurately matched with the feature sizes in FEOL, but are generally larger. Conducting materials in the BEOL are metallic elements such as copper, aluminum and tungsten. Such conducting materials can be deposited into the BEOL through vapor deposition or sputtering. The deposition pattern to make circuitry for these materials is controlled through photo-etchable materials or finely etched masks. Phase change metals can judiciously placed over FEOL circuits that are dissipating a large amount of heat. The phase change materials can be deposited to form micro heatsinks directly above respective FEOL circuits.

Special consideration needs to be given to ensure that the placement of the phase change materials does not interfere with the electrical wiring of the BEOL. The low-melting temperature of the phase change materials would also make them compatible with the deposition processes described above. Tungsten used in BEOL circuitry for layer to layer vias and other features has one of the highest thermal conductivities of any material. Attaching a tungsten trace feature to the phase change heatsink and routing it to an external surface of the chip can provide an excellent conduit for piping heat away from high-power circuits and off the chip.

Referring now to the drawings and in particular to FIG. 1, there is depicted a high-level logic flow diagram of a method for manufacturing phase change heatsinks, in accordance with a preferred embodiment of the present invention. At the FEOL stage, active devices are formed onto a silicon wafer, as shown in block 11. A passivation layer, such as oxi-nitride, is then deposited on the active devices, as depicted in block 12. The front end processing is completed by chemical-mechanical polishing (CMP) of the passivation layer, as shown in block 13.

At the BEOL stage, contacts to polysilicon and active devices are formed, as depicted in block 14. The contacts to active devices are formed by patterning, etching and tungsten deposition followed by CMP of tungsten. Phase change materials are then applied over various potential hot spots that can be formed by the active devices, as shown in block 15. For example, heat absorbing phase change materials, such as bismuth/indium alloy, can be applied over individual gate or macros that experience sharp transients. A layer of high thermal conductivity materials, such as diamond-like carbon, is then deposited over the phase change materials, as depicted in block 16. The addition of the high thermal conductivity materials can help quickly spread and bleed of heat. The high thermal conductivity materials and the phase change materials are then etched, as shown in block 17. The high thermal conductivity materials and the phase change materials are patterned and etched from the area over and around contacts so the contacts do not short out.

Additional layers of passivation conductive vias are applied to the phase change materials, as depicted in block 18. The additional layers of passivation are normally applied at this point to allow application of interconnection layers of metal. Additional layers of passivation and wiring including metal traces conducting heat are added to chip terminations, as shown in block 19. Included in such applications are electrically and thermally conductive vias, and some of which would be attached to the phase change material to conduct heat out of the area. Chip termination metal, i.e., flip chip bump, is applied, as depicted in block 20. Since most high-power devices are manufactured by flip chip technology, and the metal conductor bringing heat away from hot spots can terminate on the flip chip metal that can still conduct electricity as well.

At the package and test stage, the wafer is tested, as shown in block 21, and the wafer is diced into chips, as depicted in block 22. Finally, the chips are packaged, as shown in block 23. When the chips are placed in packages, thermal conductors within the chips can also route heat away from various devices within the chips.

Figure 2:
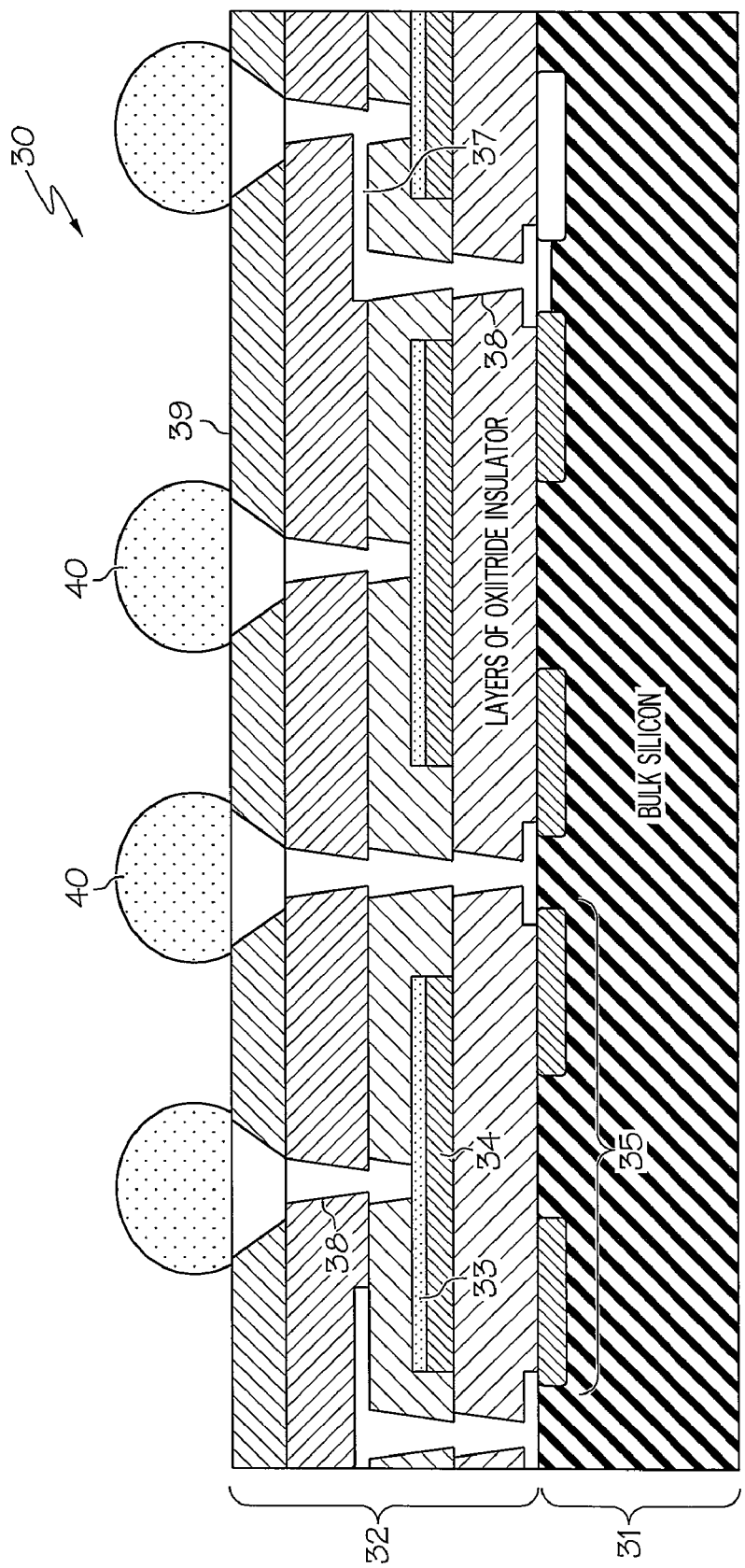
FIG. 2 is a graphical illustration of a cross-section of an integrated circuit device having phase change heatsinks manufactured according to a preferred embodiment of the present invention.

With reference now to FIG. 2, there is a graphical illustration of a cross-section of an integrated circuit device having phase change heatsinks manufactured according to a preferred embodiment of the present invention. As shown, an integrated circuit device 30 includes a bulk silicon layer 31 and an interconnection layer 32. Active devices are built on bulk silicon layer 31 during the FEOL stage. Interconnection layer 32, where vias and interconnections are formed to provide connectivity to the active devices, is built on top of bulk silicon layer 31 during the BEOL stage. The vias and interconnections within interconnection layer 32 are preferably embedded within a passivation layer 39.

A diamond-like carbon heat spreader 33 and a phase change material 34 are preferably placed directly on top of a high-power circuit 35. When high-power circuit 35 becomes hot during normal operation as a result of a power surge, phase change material 34 is capable of absorbing some of the dissipated heat from high-power circuit 35 by changing from a solid phase to a liquid phase. The heat within phase change material 34 can also be directed away from phase change material 34 through diamond-like carbon heat spreader 33 and a heat conducting via 38 preferably made of tungsten. Heat conducting via 38 can be connected to other heat conducting vias by an interconnect 37. Flip chip solder balls 40 can be utilized to connect to a next level of assembly.

Due to the low phase change temperature of the phase change materials, the high processing temperature used in fabricating integrated circuits can pose significant challenges during the production of the phase change heatsink. In order to avoid such problem, a phase change material can be deposited into the final passivation layer of the integrated circuit. At this point in the fabrication process of integrated circuits, the high temperature processing has been completed so the phase change characteristics of the phase change materials will not impact production.

Figure 3:
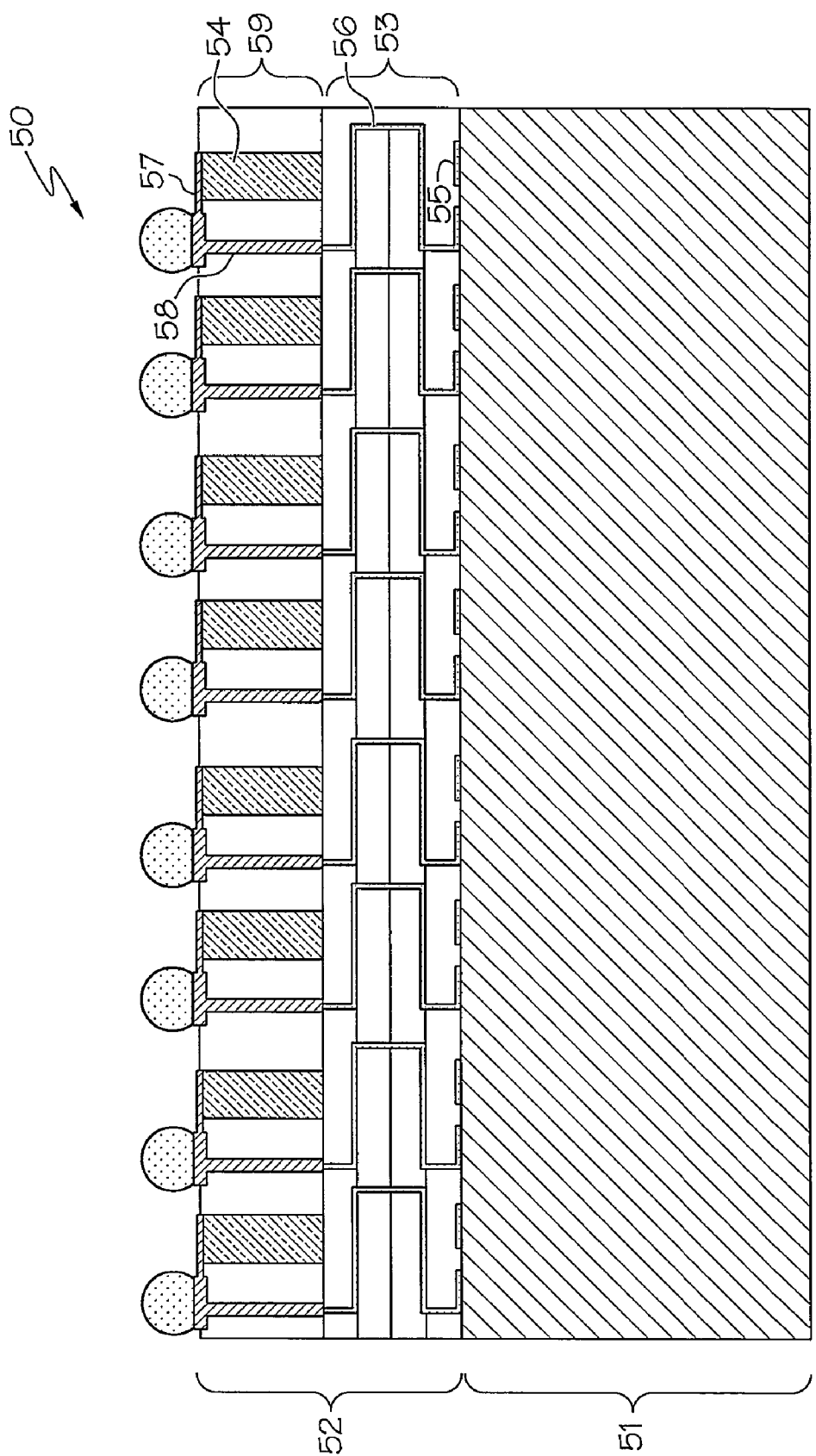
FIG. 3 is a graphical illustration of a cross-section of an integrated circuit device having phase change heatsinks manufactured according to an alternative embodiment of the present invention.

Referring now to FIG. 3, there is a graphical illustration of a cross-section of an integrated circuit device having phase change heatsinks manufactured according to an alternative embodiment of the present invention. As shown, an integrated circuit device 50 includes a bulk silicon layer 51 and an interconnection layer 52. Active devices are built on bulk silicon layer 51 during the FEOL stage. Interconnection layer 52, where vias and interconnections are formed to provide connectivity to the active devices, is built on top of bulk silicon layer 51 during the BEOL stage. Interconnection layer 52 includes layers of oxi-nitride insulator 53 in which an interconnect metal 56 provide connections between a high-power circuit 55 and a heat conducting via 58. Heat conducting via 58, preferably made of tungsten, is connected to a phase change material 54 embedded within a layer of passivation material 59 through a heat transfer trace 57.

When high-power circuit 55 becomes hot during normal operation as a result of a power surge, the heat is directed away from high-power circuit 55 by interconnect metal 56, heat conducting via 58 and heat transfer trace 57 to phase change material 54. Phase change material 54 is capable of absorbing the dissipated heat from high-power circuit 55 by changing from a solid phase to a liquid phase. While perhaps not as thermally effective as the preferred embodiment shown in FIG. 2 due to the additional material layers between active device 55 and phase change material 54, the alternative embodiment can greatly facilitate production.

As has been described, the present invention provides an improved method and apparatus for providing thermal management on high-power integrated circuit devices.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a phase change heatsink within an integrated circuit device, said method comprising:
    applying a layer of phase change materials adjacent to a potential hot spot that can be formed by an active component within said integrated circuit device without connecting to said active component electrically;
    depositing a layer of high thermal conductivity materials to form a heat spreader in direct contact with said layer of phase change materials; and
    providing a heat conducting via to direct heat away from said layer of high thermal conductivity materials, wherein said heat conducting via is in direct contact with said layer of high thermal conductivity materials.

2. The method of claim 1, wherein said heat conducting via is made of tungsten.

3. The method of claim 1, wherein said method further includes
    forming said active component on a bulk silicon during a Front End of the Line; and
    forming said layers of phase change materials, said layer of high thermal conductivity materials and said heat conducting via during a Back End of the Line.

4. The method of claim 1, wherein said method further includes applying a layer of passivation and wiring to chip terminations.

5. The method of claim 1, wherein said phase change materials are chalcogenide.

6. A heatsink within an integrated circuit device, said heatsink comprising:
    a layer of phase change materials located adjacent to a potential hot spot that can be formed by an active component within said integrated circuit device without connecting to said active component electrically;
    a heat spreader formed by a layer of high thermal conductivity materials, wherein said heat spreader is in direct contact with said layer of phase change materials; and
    a heat conducting via for directing heat away from said heat spreader, wherein said heat conducting via is in direct contact with said heat spreader.

7. The heatsink of claim 6, wherein said heatsink further includes
    said active component formed on a bulk silicon during a Front End of the Line; and
    said layers of phase change materials, said heat spreader and said heat conducting via formed on top of said bulk silicon during a Back End of the Line.

8. The heatsink of claim 6, wherein said phase change materials are chalcogenide.

9. The heatsink of claim 6, wherein said heat conducting via is made of tungsten.

10. A heatsink within an integrated circuit device, said heatsink comprising:
    an interconnect metal located adjacent to a potential hot spot that can be formed by an active component within said integrated circuit device for directing heat away from said potential hot spot, without connecting to said active component electrically;
    a layer of phase change materials; and
    a heat conducting via for directing heat from said interconnect metal to said layer of phase change materials, wherein said heat conducting via is in direct contact with said interconnect metal and said layer of phase change materials.

11. The heatsink of claim 10, wherein said heatsink further includes
    said active component formed on a bulk silicon during a Front End of the Line; and
    said layers of phase change materials formed within a passivation layer located on top of said bulk silicon during a Back End of the Line.

12. The heatsink of claim 10, wherein said phase change materials are chalcogenide.

13. The heatsink of claim 10, wherein said heat conducting via includes a heat transfer trace in direct contact with said layer of phase change materials.

14. The heatsink of claim 10, wherein said heat conducting via is made of tungsten.

* * * * *